United States Patent
Takahashi et al.

(10) Patent No.: US 8,153,340 B2
(45) Date of Patent: Apr. 10, 2012

(54) PHOTOSENSITIVE COMPOSITION, PARTITION WALLS AND BLACK MATRIX

(75) Inventors: Hideyuki Takahashi, Tokyo (JP); Kenji Ishizeki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 288 days.

(21) Appl. No.: 12/627,099

(22) Filed: Nov. 30, 2009

(65) Prior Publication Data

US 2010/0072889 A1    Mar. 25, 2010

Related U.S. Application Data

(63) Continuation of application No. PCT/JP2008/059835, filed on May 28, 2008.

(30) Foreign Application Priority Data

May 29, 2007  (JP) ................................. 2007-142104

(51) Int. Cl.
*G03F 7/004* (2006.01)
*G02B 5/20* (2006.01)

(52) U.S. Cl. ........................... 430/7; 430/287.1; 313/504

(58) Field of Classification Search ........................ None
See application file for complete search history.

(56) References Cited

U.S. PATENT DOCUMENTS

| | | | |
|---|---|---|---|
| 6,833,393 B2 | 12/2004 | Ishizeki et al. | |
| 7,232,648 B2 | 6/2007 | Takahashi et al. | |
| 7,267,929 B2 | 9/2007 | Takahashi et al. | |
| 7,494,764 B2 | 2/2009 | Takahashi et al. | |
| 2005/0175930 A1 * | 8/2005 | Lee ............................ | 430/270.1 |
| 2005/0191580 A1 | 9/2005 | Takahashi et al. | |
| 2008/0233493 A1 | 9/2008 | Ishizeki et al. | |
| 2008/0254388 A1 | 10/2008 | Takahashi et al. | |

FOREIGN PATENT DOCUMENTS

| | | |
|---|---|---|
| JP | 11281815 | 10/1999 |
| JP | 2005-060515 | 3/2005 |
| JP | 2005315986 | 11/2005 |
| JP | 2006-053569 A * | 2/2006 |
| JP | 2007033467 | 2/2007 |
| JP | 2007056221 | 3/2007 |
| WO | WO 2004/042474 | 5/2004 |
| WO | WO 2007/007800 A1 | 1/2007 |

OTHER PUBLICATIONS

Computer-generated translation of JP 2006-053569 (Feb. 2006).*
U.S. Appl. No. 12/971,032, filed Dec. 17, 2010, Takahashi, et al.
U.S. Appl. No. 12/578,625, field Oct. 14, 2009, Ishizeki, et al.
U.S. Appl. No. 12/627,727, filed Nov. 30, 2009, Ishizeki, et al.

* cited by examiner

*Primary Examiner* — John A. McPherson
(74) *Attorney, Agent, or Firm* — Oblon, Spivak, McClelland, Maier & Neustadt, L.L.P.

(57) ABSTRACT

To provide a photosensitive composition with which it is possible to form partition walls (black matrix) having excellent light shielding properties and liquid repellency.

A photosensitive composition, which comprises a polymer (A) having a side chain containing a fluorine atom-containing group or a silicon atom-containing group and a side chain containing an ethylenic double bond in one molecule, a black colorant (B), a photopolymerization initiator (C) which is an O-acyloxime compound, and a photosensitive resin (D) containing an acidic group and an ethylenic double bond in one molecule, wherein the proportion of the black colorant (B) in the total solid content of the composition is from 15 to 60 mass %.

13 Claims, No Drawings

PHOTOSENSITIVE COMPOSITION, PARTITION WALLS AND BLACK MATRIX

TECHNICAL FIELD

The present invention relates to a black matrix to be used for formation of a color filter and an organic EL display device employing an ink jet printing technique, and a photosensitive composition to be used for formation of the black matrix.

BACKGROUND ART

In recent years, a low cost process utilizing an ink jet method has been proposed as a process for producing a color filter or an inorganic EL display device.

For example, in production of a color filter, partition walls constituting a black matrix are formed by photolithography, and then open areas (dots) surrounded by the partition walls are sprayed and coated with inks of R (red), G (green) and B (blue) by an ink jet method to form pixels.

In production of an organic EL display device, partition walls constituting a black matrix are formed by photolithography, and then open areas (dots) surrounded by the partition walls are sprayed and coated with solutions of a hole transport material and a luminescent material by an ink jet method to form pixels having a hole transport layer, a luminescent layer, etc.

In recent years, to improve the contrast of colors of a color filter and an organic EL display device, the black matrix is required to have higher light shielding properties.

Further, for cost reduction and improvement in the productivity, a black matrix forming material is required to have high sensitivity with which patterning is possible with low light exposure.

Further, in the ink jet method, it is necessary to prevent color mixing of inks between adjacent pixels. Accordingly, the partition walls are required to have a repellency against water, an organic solvent or the like constituting the ink jet coating solution, i.e. a so-called liquid repellency. Further, an ink layer to be formed in the pixels by the ink jet method is required to have a high uniformity in the thickness, and accordingly the open areas (dots) surrounded by the partition walls are required to have wettability by an ink jet discharged solution, i.e. a so-called liquid affinity.

Patent Document 1 discloses a photosensitive resin composition comprising a compound obtained by reading 2-methacryloyloxyethyl isocyanate with a copolymer of 2-(perfluorohexyl)ethyl methacrylate, 2-hydroxyethyl methacrylate and methacrylic acid as an ink repellent, carbon black as a black colorant, 2-methyl-1-[4-(methylthio)phenyl]-2-morpholinopropan-1-one as a photopolymerization initiator, an epoxyacrylate resin as a photosensitive resin, and dipentaerythritol pentaacrylate as a radical crosslinking agent. The proportion of carbon black in the total solid content of the photosensitive resin composition is 13.7 mass %.
Patent Document 1: WO2004/042474 (Table 4, Example 16)

DISCLOSURE OF THE INVENTION

Object to be Accomplished by the Invention

Partition walls to be obtained from the above conventional composition has liquid repellency, but is insufficient in the degree of blackness, i.e. the optical density (OD) value, and it is thereby necessary to significantly increase the amount of the black colorant so as to achieve a higher optical density. However, by increasing the amount of the black colorant, the liquid repellency tends to be insufficient. Further, if the light exposure is decreased, the insufficiency of the liquid repellency is more remarkable.

Accordingly, it is an object of the present invention to provide a photosensitive composition with which it is possible to form partition walls having excellent light shielding properties and liquid repellency even in a case where the light exposure is reduced.

Means to Accomplish the Object

The present inventors have found that by incorporating a specific photopolymerization initiator to a photosensitive composition, partition walls having high light shielding properties and also being excellent in the liquid repellency can be formed even in a case where the light exposure is reduced at the time of exposure, and accomplished the present invention.

The present invention provides a photosensitive composition, which comprises a polymer (A) having a side chain containing a group represented by the following formula (1) or a group represented by the following formula (2) and a side chain containing an ethylenic double bond in one molecule, a black colorant (B), a photopolymerization initiator (C) which is a compound represented by the following formula (3), and a photosensitive resin (D) containing an acidic group and an ethylenic double bond in one molecule, wherein the proportion of the black colorant (B) in the total solid content of the composition is from 15 to 60 mass %:

—CFXR$^f$　　　　　formula (1)

wherein X is a hydrogen atom, a fluorine atom or a trifluoromethyl group, and R$^f$ is an alkyl group having at most 20 carbon atoms which may have an etheric oxygen atom, at least one of hydrogen atoms of which is substituted by a fluorine atom, or a fluorine atom;

—(SiR$^1$R$^2$O)$_n$—SiR$^1$R$^2$R$^3$　　　　　formula (2)

wherein each of R$^1$ and R$^2$ which are independent of each other, is a hydrogen atom, an alkyl group, a cycloalkyl group or an aryl group, R$^3$ is a hydrogen atom or a $C_{1-10}$ organic group, and n is an integer of from 1 to 200;

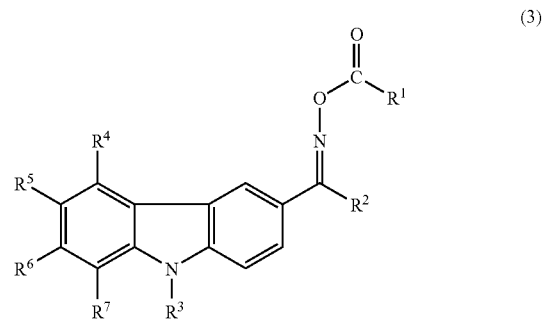

(3)

wherein R$^1$ is a hydrogen atom, a $C_{1-12}$ alkyl group, a $C_{3-8}$ cycloalkyl group, a $C_{2-5}$ alkenyl group, a $C_{6-20}$ phenyl group or a $C_{6-20}$ phenoxy group of which a hydrogen atom in the benzene ring may be substituted by an alkyl group;

R$^2$ is a hydrogen atom, a $C_{1-20}$ alkyl group, a $C_{3-8}$ cycloalkyl group, a $C_{6-20}$ phenyl group of which a hydrogen atom in the benzene ring may be substituted by an alkyl group, a $C_{2-20}$ alkanoyl group, a $C_{7-20}$ benzoyl group of which a hydrogen atom in the benzene ring may be substituted by an alkyl group, a $C_{2-12}$ alkoxycarbonyl group, or a $C_{7-20}$ phenoxycarbonyl group of which a hydrogen atom in the benzene ring may be substituted by an alkyl group;

$R^3$ is a $C_{1-12}$ alkyl group; and each of $R^4$, $R^5$, $R^6$ and $R^7$ which are independent of one another, is a hydrogen atom, a $C_{1-12}$ alkyl group, a $C_{3-8}$ cycloalkyl group of which a hydrogen atom in the cyclohexane ring may be substituted by an alkyl group, a $C_{6-20}$ phenyl group of which a hydrogen atom in the benzene ring may be substituted by an alkyl group, a $C_{2-20}$ alkanoyl group, a $C_{7-20}$ benzoyl group of which a hydrogen atom in the benzene ring may be substituted by an alkyl group, a $C_{7-20}$ benzylcarbonyl group of which a hydrogen atom in the benzene ring may be substituted by an alkyl group, a $C_{2-12}$ alkoxycarbonyl group, a $C_{7-20}$ phenoxycarbonyl group of which a hydrogen atom in the benzene ring may be substituted by an alkyl group, a $C_{1-20}$ amide group or a nitro group.

The above polymer (A) preferably has a side chain containing at least two ethylenic double bonds per one side chain.

The polymer (A) preferably further has a side chain containing an acidic group.

The acid value of the polymer (A) is preferably at most 100 (mgKOH/g).

The amount of the ethylenic double bonds in the polymer (A) is preferably from $1.0 \times 10^{-3}$ to $5.0 \times 10^{-3}$ mol/g.

The black colorant (B) is preferably carbon black.

The proportion of the photopolymerization initiator (C) in the total solid content of the photosensitive composition is preferably from 1 to 10 mass %.

The above composition preferably further contains a radical crosslinking agent (E) containing at least two ethylenic double bonds and containing no acidic group.

The present invention further provides partition walls having a cured product of the above photosensitive composition.

The present invention further provides the above partition walls, wherein of the cured product, the contact angle to water is at least 90°, and the contact angle to PGMEA is at least 20°.

The present invention further provides a black matrix comprising the above partition walls.

The present invention further provides a color filter, which comprises a substrate, a plurality of pixels on the substrate, and partition walls located among the adjacent pixels, wherein the partition walls are made of a cured product of the above photosensitive composition.

The present invention still further provides an organic EL device, which comprises a substrate, a plurality of pixels on the substrate, and partition walls located among the adjacent pixels, wherein the partition walls are made of a cured product of the above photosensitive composition.

Effects of the Invention

With the photosensitive composition of the present invention, partition walls having high height shielding properties and excellent liquid repellency can be formed. Particularly in a case where the light exposure is reduced in the exposure step, partition walls having excellent liquid repellency can be formed. Accordingly, in a color filter and an organic EL display device having the partition walls of the present invention, color mixing of inks can be suppressed.

BEST MODE FOR CARRYING OUT THE INVENTION

Now, the present invention will be described in further detail below. In the present specification, "%" means "mass %" unless otherwise specified. Further, a (meth)acryloyl group generically means both acryloyl group and methacryloyl group. A (meth)acrylate generically means both acrylate and methacrylate. (Meth)acrylic acid generically means both acrylic acid and methacrylic acid. (Meth)acrylamide generically means both acrylamide and methacrylamide. Further, meth(aryl) generically means both aryl and methacryl.

In the present specification, a group represented by the formula (1) will be referred to as a group (1). The same applies to other groups.

In the present specification, a monomer represented by the formula (11) will be referred to as a monomer (11). The same applies to other monomers.

The polymer (A) has a side chain containing a group (1) or a group (2) and a side chain containing an ethylenic double bond:

$$—CFXR^f \qquad (1)$$

wherein X is a hydrogen atom, a fluorine atom or a trifluoromethyl group, and $R^f$ is an alkyl group having at most 20 carbon atoms which may have an etheric oxygen atom, at least one of hydrogen atoms of which is substituted by a fluorine atom, or a fluorine atom:

$$—(SiR^1R^2—O)_n—SiR^1R^2R^3 \qquad (2)$$

wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.

The polymer (A) contained in the photosensitive composition of the present invention, which has a side chain containing the group (1) or the group (2), has surface migration property, and when a coating film of the composition is dried by heating, it migrates to the vicinity of the surface of the coating film. Accordingly, the upper surface of the partition walls formed from a coating film cured product has liquid repellency, and inks injected by an ink jet method will not flow over from dots (portions to be pixels), whereby color mixing between adjacent pixels is hardly occur. Further, since the polymer (A) has a side chain containing an ethylenic double bond, it is likely to be fixed on the upper surface of the partition walls by the curing reaction of the polymer (A) at the time of exposure. Accordingly, staining of dots by migration of unreacted residual molecules to the dots will hardly occur at the time of postbaking after the exposure and the development.

The side chain containing the group (1) or the group (2) may be formed directly by the polymerization reaction or may be formed by a chemical conversion after the polymerization reaction. Further, a side chain containing an ethylenic double bond can be formed by a chemical conversion after the polymerization reaction.

In a case where $R^f$ in the above formula (1) is an alkyl group having at most 20 carbon atoms which may contain an etheric oxygen atom, at least one of hydrogen atoms of which is substituted by a fluorine atom, hydrogen atoms in the alkyl group may be substituted by a halogen atom other than a fluorine atom. Such a halogen atom is preferably a chlorine atom. Further, the etheric oxygen atom may be present between the carbon-carbon bond in the alkyl group, or may be present at the terminal of the alkyl group. Further, the structure of the alkyl group may be a chain structure, a branched structure, a cyclic structure or a structure partially having a cyclic structure, and is preferably a chain structure.

As specific examples of the group (1), the following may be mentioned.

—$CF_3$, —$CF_2CF_3$, —$CF_2CHF_2$, —$(CF_2)_2CF_3$,
—$(CF_2)_3CF_3$, —$(CF_2)_4CF_3$, —$(CF_2)_5CF_3$,
—$(CF_2)_6CF_3$, —$(CF_2)_7CF_3$, —$(CF_2)_8CF_3$, —$(CF_2)_9CF_3$,
—$(CF_2)_{11}CF_3$, —$(CF_2)_{15}CF_3$,
—$CF(CF_3)O(CF_2)_5CF_3$,
—$CF_2O(CF_2CF_2O)_pCF_3$ (p is an integer of from 1 to 8),
—$CF(CF_3)O(CF_2CF(CF_3)O)_qC_6F_{13}$ (q is an integer of from 1 to 4), and
—$CF(CF_3)O(CF_2CF(CF_3)O)_rC_3F_7$ (r is an integer of from 1 to 5).

The above group (1) is preferably a perfluoroalkyl group or a polyfluoroalkyl group containing one hydrogen atom, particularly preferably a perfluoroalkyl group (provided that the above alkyl group includes one having an etheric oxygen atom), whereby the partition walls to be formed from the photosensitive composition have good liquid repellency. Further, the above group (1) preferably has from 4 to 6 carbon atoms in total. In such a case, sufficient liquid repellency will be imparted to the partition walls and in addition, the compatibility of the polymer (A) with other components constituting the photosensitive composition will be good, and when the photosensitive composition is applied to form a coating film, the polymer (A) molecules will not aggregate, and partition walls having good outer appearance will be formed.

In the above formula (2), a plurality of $R^1$'s and a plurality of $R^2$'s in the respective siloxane units may be the same or different. Each of $R^1$ and $R^2$ is preferably a hydrogen atom, a $C_{1-10}$ alkyl group, a cycloalkyl group or an aryl group, more preferably a hydrogen atom, a methyl group or a phenyl group, and particularly preferably $R^1$'s and $R^2$'s in all the siloxane units are methyl groups, whereby partition walls to be formed from the photosensitive composition have excellent liquid repellency. Further, in a case where $R^3$ is an organic group, it may contain a nitrogen atom, an oxygen atom or the like, and $R^3$ is preferably a hydrogen atom or a $C_{1-5}$ alkyl group. n is preferably an integer of from 1 to 200, more preferably an integer of from 2 to 100.

The ethylenic double bond may, for example, be an addition-polymerizable unsaturated group such as a (meth)acryloyl group, an allyl group, a vinyl group or a vinyl ether group. Some or all of hydrogen atoms in such a group may be substituted by a hydrocarbon group. The hydrocarbon group is preferably a methyl group.

The polymer (A) is preferably a polymer further having a side chain containing an acidic group. Some molecules of the polymer (A) not cured in the exposure step will be washed off from the surface of the partition walls in the development step, as they have the side chain containing an acidic group, whereby residual molecules not fixed in the partition walls scarcely remain. It is thereby possible to further reduce molecules which may otherwise migrate to the dots at a state prior to the postbaking step, whereby the liquid affinity of the dots will be higher.

The acidic group is preferably at least one acidic group selected from the group consisting of a carboxy group, a phenolic hydroxy group and a sulfonic acid group.

The side chain containing an acidic group may be formed by the polymerization reaction of the monomer containing an acidic group or may be formed by a chemical conversion after the polymerization reaction.

The polymer (A) of the present invention can be prepared by copolymerizing at least two monomers including a monomer (a1) containing the group (1) or a monomer (a2) containing the group (2) and a monomer (a3) containing a reactive group, and then reacting the obtained copolymer with a compound (z1) containing a functional group capable of being bonded with the above reactive group and an ethylenic double bond.

The monomer (a1) containing the group (1) is preferably the following monomer (11).

$$CH_2=CR^4COO—Y—CFXR^f \qquad (11)$$

wherein $R^4$ is a hydrogen atom, a fluorine atom, a chlorine atom, a bromine atom, an iodine atom, a methyl group or a trifluoromethyl group, Y is a single bond or a $C_{1-6}$ bivalent organic group containing no fluorine atom, and $R^f$ is an alkyl group having at most 20 carbon atoms which may have an etheric oxygen atom, at least one of hydrogen atoms of which is substituted by a fluorine atom, or a fluorine atom.

In the monomer (11), the preferred embodiment of —$CFXR^f$ is as defined for the above group (1). In the monomer (11), Y is preferably a $C_{2-4}$ alkylene group in view of the availability.

As examples of the monomer (11), the following may be mentioned.

$CH_2=CR^4COOR^5CFXR^f$ $CH_2=CR^4COOR^5NR^6SO_2CFXR^f$ $CH_2=CR^4COOR^5NR^6COCFXR^f$ $CH_2=CR^4COOCH_2CH(OH)R^7CFXR^f$

In the above formulae, $R^4$ is a hydrogen atom, a fluorine atom, a chlorine atom, a bromine atom, an iodine atom, a methyl group or a trifluoromethyl group, $R^5$ is a $C_{1-6}$ alkylene group, $R^6$ is a hydrogen atom or a methyl group, $R^7$ is a single bond or a $C_{1-4}$ alkylene group, and $R^f$ is as defined above.

Specific examples of $R^5$ may, for example, be —$CH_2$—, —$CH_2CH_2$—, —$CH(CH_3)$—, —$CH_2CH_2CH_2$—, —$C(CH_3)_2$—, —$CH(CH_2CH_3)$—, —$CH_2CH_2CH_2CH_2$—, —$CH(CH_2CH_2CH_3)$—, —$CH_2(CH_2)_3CH_2$— and —$CH(CH_2CH(CH_3)_2)$—.

Specific examples of $R^7$ may, for example, be —$CH_2$—, —$CH_2CH_2$—, —$CH(CH_3)$—, —$CH_2CH_2CH_2$—, —$C(CH_3)_2$—, —$CH(CH_2CH_3)$—, —$CH_2CH_2CH_2CH_2$—and —$CH(CH_2CH_2CH_3)$—.

Specific examples of the monomer (11) may, for example, be 2-(perfluorohexyl)ethyl (meth)acrylate and 2-(perfluorobutyl)ethyl (meth)acrylate. The monomers (11) may be used alone or in combination as a mixture of two or more of them.

The monomer (a2) containing the group (2) is preferably the following monomer (21):

$$CH_2=CR^8COO—Z—(SiR^1R^2O)_n—SiR^1R^2R^3 \qquad (21)$$

wherein $R^8$ is a hydrogen atom or a methyl group, Z is a single bond or a $C_{1-6}$ bivalent organic group, each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.

In the monomer (a21), the preferred embodiment of $R^1$, $R^2$, $R^3$ and n is as defined for the above group (2).

Z is preferably a $C_{1-6}$ bivalent hydrocarbon group. As specific examples, the following may be mentioned.
—$CH_2$—, —$CH_2CH_2$—, —$CH(CH_3)$—,
—$CH_2CH_2CH_2$—, —$C(CH_3)_2$—, —$CH(CH_2CH_3)$—,
—$CH_2CH_2CH_2CH_2$—, —$CH(CH_2CH_2CH_3)$—,
—$CH_2(CH_2)_3CH_2$—, —$CH(CH_2CH(CH_3)_2)$—, etc.

The above monomers (21) may be used alone or in combination as a mixture of two or more of them.

The monomer (a3) containing a reactive group may, for example, be a monomer containing a hydroxy group, an acid anhydride monomer containing an ethylenic double bond, a monomer containing a carboxy group or a monomer containing an epoxy group. The monomer (a3) preferably contains substantially no group (1) nor group (2).

The reactive group of the monomer (a3) after the copolymerization is reacted with the compound (z1) containing a functional group capable of being bonded with the reactive group and an ethylenic double bond, whereby the polymer (A) having a side chain containing an ethylenic double bond is formed.

Specific examples of the monomer containing a hydroxy group may, for example, be 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, glycerol mono(meth)acrylate, 2-hydroxyethyl vinyl ether, 4-hydroxybutyl vinyl ether, cyclohexanediol monovinyl ether, 2-hydroxyethyl allyl ether, N-hydroxymethyl (meth)acrylamide and N,N-bis(hydroxymethyl) (meth)acrylamide.

Further, the monomer containing a hydroxy group may be a monomer having a polyoxyalkylene chain with a terminal hydroxy group. It may, for example, be $CH_2=CHOCH_2C_6H_{10}CH_2O(C_2H_4O)_kH$ (wherein k is an integer of from 1 to 100, the same applies hereinafter), $CH_2=CHOC_4H_8O(C_2H_4O)_kH$, $CH_2=CHCOOC_2H_4O(C_2H_4O)_kH$, $CH_2=C(CH_3)COOC_2H_4O(C_2H_4O)_kH$ or $CH_2=CHCOOC_2H_4O(C_2H_4O)_m(C_3H_6O)_jH$ (wherein m is 0 or an integer of from 1 to 100, and j is an integer of from 1 to 100, provided that m+j is from 1 to 100, the same applies hereinafter), or $CH_2=C(CH_3)COOC_2H_4O(C_2H_4O)_m(C_3H_6O)_jH$.

Specific examples of the acid anhydride monomer containing an ethylenic double bond may, for example, be maleic anhydride, itaconic anhydride, citraconic anhydride, methyl-5-norbornene-2,3-dicarboxylic anhydride, 3,4,5,6-tetrahydrophthalic anhydride, cis-1,2,3,6-tetrahydrophthalic anhydride and 2-buten-1-yl succinic anhydride.

Specific examples of the monomer containing a carboxy group may, for example, be acrylic acid, methacrylic acid, vinyl acetic acid, crotonic acid, itaconic acid, maleic acid, fumaric acid, cinnamic acid and their salts.

Specific examples of the monomer containing an epoxy group may, for example, be glycidyl (meth)acrylate and 3,4-epoxycyclohexylmethyl acrylate.

In a case where the polymer (A) has a side chain containing an acidic group, it is preferred to copolymerize a monomer (a4) containing an acidic group together with the monomers (a1) to (a3).

The monomer (a4) containing an acidic group may, for example, be a monomer containing a carboxy group, a monomer containing a phenolic hydroxy group or a monomer containing a sulfonic acid group. In a case where a monomer containing a carboxy group is used as the monomer (a4) containing an acidic group and a monomer containing a carboxy group is used also as the above monomer (a3) containing a reactive group, one having no ethylenic double bond finally introduced and having a residual carboxy group, will be deemed to be the monomer (a4).

The monomer containing a phenolic hydroxy group may, for example, be o-hydroxystyrene, m-hydroxystyrene or p-hydroxystyrene. Or, it may be a compound having at least one hydrogen atom in such a benzene ring substituted by an alkyl group such as a methyl group, an ethyl group or a n-butyl group, an alkoxy group such as a methoxy group, an ethoxy group or a n-butoxy group, a halogen atom, a haloalkyl group having at lease one hydrogen atom of an alkyl group substituted by a halogen atom, a nitro group, a cyano group, or an amide group.

The monomer containing a sulfonic acid group may, for example, be vinyl sulfonic acid, styrene sulfonic acid, (meth)allyl sulfonic acid, 2-hydroxy-3-(meth)allyloxypropane sulfonic acid, 2-sulfoethyl (meth)acrylate, 2-sulfopropyl (meth)acrylate, 2-hydroxy-3-(meth)acryloxypropane sulfonic acid, or 2-(meth)acrylamide-2-methylpropane sulfonic acid.

The monomer to be used for the polymerization in the present invention may contain a monomer (a5) other than the monomer (a1) containing the group (1), the monomer (a2) containing the group (2), the monomer (a3) containing a reactive group and a monomer (a4) containing an acidic group.

Such other monomer (a5) may, for example, be a hydrocarbon type olefin, a vinyl ether, an isopropenyl ether, an allyl ether, a vinyl ester, an allyl ester, a (meth)acrylate, a (meth)acrylamide, an aromatic vinyl compound, a chloroolefin or a conjugated diene. Such a compound may contain a functional group, and the functional group may, for example, be a carbonyl group or an alkoxy group. A (meth)acrylate or (meth)acrylamide is particularly preferred, since the heat resistance of the partition walls will thereby be excellent.

The polymer (A) may be prepared, for example, by the following method. Firstly, the monomers are dissolved in a solvent and heated, and a polymerization initiator is added to carry out copolymerization. In the copolymerization reaction, a chain transfer agent may preferably be present, as the case requires. The monomers, the polymerization initiator, the solvent and the chain transfer agent may continuously be added.

The above solvent may, for example, be an alcohol such as ethanol, 1-propanol, 2-propanol, 1-butanol or ethylene glycol; a ketone such as acetone, methyl isobutyl ketone or cyclohexanone; a cellosolve such as 2-methoxyethanol, 2-ethoxyethanol or 2-butoxyethanol; a carbitol such as 2-(2-methoxyethoxy)ethanol, 2-(2-ethoxyethoxy)ethanol or 2-(2-butoxyethoxy)ethanol; an ester such as methyl acetate, ethyl acetate, n-butyl acetate, ethyl lactate, n-butyl lactate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, ethylene glycol diacetate, propylene glycol diacetate, ethyl-3-ethoxypropionate, cyclohexanol acetate, butyl lactate, γ-butyrolactone, 3-methyl-3-methoxybutyl acetate, ethyl lactate, n-butyl lactate, γ-butyrolactone, 3-methoxybutyl acetate, 3-methyl-3-methoxybutyl acetate or glycerol triacetate; or diethylene glycol dimethyl ether, diethylene glycol diethyl ether, diethylene glycol dibutyl ether, triethylene glycol dimethyl ether, tetraethylene glycol dimethyl ether, propylene glycol dimethyl ether, dipropylene glycol dimethyl ether, dibutyl ether or diethylene glycol methyl ethyl ether.

As the polymerization initiator, a known organic peroxide, an inorganic peroxide, or an azo compound may, for example, be mentioned. The organic peroxide and the inorganic peroxide may be used in combination with a reducing agent in the form of a redox catalyst.

The organic peroxide may, for example, be benzoyl peroxide, lauroyl peroxide, isobutyryl peroxide, t-butyl hydroperoxide or t-butyl-α-cumyl peroxide. The inorganic peroxide may, for example, be ammonium persulfate, sodium persulfate, potassium persulfate, hydrogen peroxide or a percarbonate. The azo compound may, for example, be 2,2'-azobisisobutyronitrile, 1,1'-azobis(cyclohexane-1-carbonitrile), 2,2'-azobis(2,4-dimethylvaleronitrile), 2,2'-azobis(4-methoxy-2,4-dimethylvaleronitrile), dimethyl 2,2'-azobisisobutyrate or 2,2'-azobis(2-amidinopropane)dihydrochloride.

The chain transfer agent may, for example, be a mercaptan such as n-butylmercaptan, n-dodecylmercaptan, t-butylmercaptan, ethyl thioglycolate, 2-ethylhexyl thioglycolate or 2-mercaptoethanol; or an alkyl halide such as chloroform, carbon tetrachloride or carbon tetrabromide.

The copolymer obtained as described above is reacted with a compound (z1) containing a functional group capable of being bonded with the reactive group and an ethylenic double bond to obtain the polymer (A).

The following combinations may, for example, be mentioned as a combination of a reactive group to the compound (z1) containing a functional group capable of being bonded with the reactive group and an ethylenic double bond.

(1) A hydroxy group to an acid anhydride containing an ethylenic double bond.

(2) A hydroxy group to a compound containing an isocyanate group and an ethylenic double bond.

(3) A hydroxy group to a compound containing a chlorinated acyl group and an ethylenic double bond.

(4) An acid anhydride to a compound containing a hydroxy group and an ethylenic double bond.

(5) A carboxy group to a compound containing an epoxy group and an ethylenic double bond.

(6) An epoxy group to a compound containing a carboxy group and an ethylenic double bond.

As specific; examples for the acid anhydride containing an ethylenic double bond, the above-mentioned examples may be mentioned. As specific examples for the compound containing an isocyanate group and an ethylenic double bond, 2-(meth)acryloyloxyethyl isocyanate and 1,1-bis((meth)acryloyloxymethyl)ethyl isocyanate may be mentioned. As a specific example for the compound containing a chlorinated acyl group and an ethylenic double bond, (meth)acryloyl chloride may be mentioned. As specific examples for the compound containing a hydroxy group and an ethylenic double bond, the above-mentioned examples for the monomer containing a hydroxy group may be mentioned. As specific examples for the compound containing an epoxy group and an ethylenic double bond, the above-mentioned examples for the monomer containing an epoxy group may be mentioned. As specific examples for the compound containing a carboxy group and an ethylenic double bond, the above-mentioned examples for the monomer containing a carboxy group may be mentioned.

As the above combination, particularly preferred is a combination of a hydroxy group to 1,1-bis((meth)acryloyloxymethyl)ethyl isocyanate, whereby the polymer (A) has a side chain containing at least two ethylenic double bonds per one side chain, and the polymer (A) thereby has excellent fixing property to the surface of partition walls, and accordingly partition walls excellent in the liquid repellency will be obtained.

When the copolymer is reacted with the compound (z1) containing a functional group capable of being bonded with the reactive group and an ethylenic double bond, the solvent exemplified in the above-described preparation of the copolymer may be used as the solvent to be used for the reaction.

Further, a polymerization inhibitor may preferably be blended. The polymerization inhibitor may, for example, be 2,6-di-t-butyl-p-cresol.

Further, a catalyst or a neutralizing agent may be added. For example, in a case where a copolymer having a hydroxy group is to be reacted with a compound containing an isocyanate group and an ethylenic double bond, a tin compound or the like may be used. In a case where a copolymer containing a hydroxy group is to be reacted with a compound containing a chlorinated acyl group and an ethylenic double bond, a basic catalyst may be used.

The preferred proportion of each monomer based on the total mass of monomers to be copolymerized is as follows. The proportion of the monomer (a1) containing the group (1) or the monomer (a2) containing the group (2) is preferably from 20 to 80 mass %, more preferably from 30 to 60 mass %. As the proportion is high, the polymer (A) of the present invention will be excellent in the effect to lower the surface tension of the partition walls made of a coating film cured product to be formed, and a high liquid repellency will be imparted to the partition walls. On the other hand, if the proportion is to high, the adhesion between the partition walls and the substrate tends to be low. The proportion of the monomer (a3) containing a reactive group is preferably from 20 to 70 mass %, more preferably from 30 to 50 mass %. Within such a range, the polymer (A) will have good developabilty and fixing property to partition walls. The proportion of the monomer (a4) containing an acidic group is preferably from 2 to 20 mass %, more preferably from 4 to 12 mass %. Within such a range, the residual molecules not fixed in the exposure step will be readily washed off from the partition walls in the development step. The proportion of other monomer (a5) is preferably at most 70 mass %, more preferably at most 50 mass %. When the proportion is within such a range, the alkali solubility and the developability will be good.

It is preferred that the copolymer and the compound (z1) are charged so that the equivalent ratio of [functional group of the compound (z1)]/[reactive group of the copolymer] would be from 0.5 to 2.0. As the equivalent ratio is high, the polymer (A) will have good fixing property to partition walls. On the other hand, if the equivalent ratio is too high, an impurity as an unreacted compound (z1) increases, whereby the appearance of a coating film will be deteriorated. The equivalent ratio is more preferably from 0.8 to 1.5. Further, in a case where a monomer having a carboxy group is used for both of the monomer (a3) containing a reactive group and the monomer (a4) containing an acidic group, the amounts of the copolymer and the compound (z1) to be charged may be adjusted so that the acid value of the polymer (A) is an aimed value.

In a case where the polymer (A) has the group (1), the content of fluorine atoms of the polymer (A) is preferably from 5 to 35 mass %. The higher the content, the more the polymer (A) will be excellent in the effect to lower the surface tension of the partition walls, whereby partition walls excellent in the liquid repellency will be obtained. On the other hand, if the content is too high, the adhesion between the partition walls and the substrate tends to be low. The content of fluorine atoms in the polymer (A) is more preferably such that the lower limit is 10 mass %, and the upper limit is 30 mass %.

In a case where the polymer (A) has the group (2), the content of silicon atoms of the polymer (A) is preferably from 0.1 to 25 mass %. The higher the content, the more the polymer (A) will be excellent in the effect to lower the surface tension of the partition walls to be formed and the effect to improve the ink falling property. On the other hand, if the content is too high, the adhesion between the partition walls and the substrate tends to be low. The content of silicon atoms of the polymer (A) is more preferably such that the lower limit is 0.5 mass %, and the upper limit is 10 mass %.

The amount of the ethylenic double bonds in the polymer (A) is preferably from $1.0 \times 10^{-3}$ to $5.0 \times 10^{-3}$ mol/g, more preferably from $2.5 \times 10^{-3}$ to $4.5 \times 10^{-3}$ mol/g. Within such a range, the polymer (A) will have good developability and fixing property to partition walls.

The acid value of the polymer (A) is preferably at most 100 (mgKOH/g), more preferably from 10 to 50 (mgKOH/g). Within such a range, the residual molecules not fixed in the exposure step will be readily washed off from the partition walls in the development step. Here, the acid value is the mass (unit: mg) of potassium hydroxide required to neutralize 1 g of the resin, and in this specification, the unit is identified by mgKOH/g.

The number average molecular weight of the polymer (A) is preferably at least 1,500 and less than 50,000, more preferably at least 3,000 and less than 30,000. Within such a range, the alkali solubility and the developability are good.

The proportion of the polymer (A) in the total solid content of the photosensitive composition of the present invention is preferably from 0.01 to 30 mass %. When such a proportion is high, the polymer (A) will be excellent in the effect to lower the surface tension of the partition walls to be formed, and partition walls excellent in the liquid repellency will be obtained. On the other hand, if the proportion is too high, the adhesion between the partition walls and the substrate tends to be low. The proportion of the polymer (A) in the total solid content of the composition is more preferably such that the lower limit is 0.05 mass % and the upper limit is 20 mass %.

The polymer (A) in the present invention may have both side chain containing the group (1) and side chain containing the group (2) in one molecule. Further, the photosensitive composition of the present invention may comprise both polymer (A) having a side chain containing the group (1) and the polymer (A) having a side chain containing the group (2). In such a case, the photosensitive composition has high liquid repellency and ink falling property.

The photosensitive composition of the present invention contains a black colorant (B). The proportion of the black colorant (B) in the total solid content of the composition is from 15 to 60 mass %. If it is less than 15 mass %, the partition walls to be obtained will be insufficient in the optical density. If it exceeds 60 mass %, the curing property will be deteriorated, the outer appearance of the coating film will be deteriorated, and the liquid repellency will be low. It is preferably from 20 to 50 mass %, more preferably from 25 to 40 mass %.

The black colorant (B) may, for example, be carbon black, aniline black, anthraquinone black pigment or perylene black pigment, e.g. specifically, C. I. Pigment Black 1, 6, 7, 12, 20 or 31. It is also possible to use a mixture of organic or inorganic pigments of e.g. red, blue and green pigments, as the black colorant (B). As the black colorant (B), carbon black is preferred from the viewpoint of the price and good light shielding properties. Such carbon black may be surface-treated with e.g. a resin. Further, in order to adjust the color tone, a blue pigment or a purple pigment may be used in combination.

The carbon black is preferably one having a specific surface area of from 50 to 200 m$^2$/g as measured by BET method, from the viewpoint of the shape of the black matrix. If carbon black having a specific surface area of less than 50 m$^2$/g is used, the black matrix shape will be deteriorated, and if carbon black having a specific surface area exceeding 200 m$^2$/g is used, a dispersion aid is likely to be excessively adsorbed on the carbon black, whereby it will be required to incorporate a large amount of a dispersion aid in order to obtain various physical properties.

Further, the carbon black is preferably one having dibutyl phthalate oil absorption of at most 120 cc/100 g from the viewpoint of the sensitivity. The smaller the oil absorption, the better.

Further, the average primary particle size of carbon black as observed by a transmission electron microscope is preferably from 20 to 50 nm. If the average primary particle size is too small, it tends to be difficult to disperse carbon black at a high concentration, whereby a photosensitive black composition having good stability with time will hardly be obtained, and if the average primary particle size is too large, the black matrix shape will be deteriorated. The preferred average secondary particle size is from 80 to 200 nm.

In order to improve dispersibility of the black colorant (B) in the photosensitive composition, it is preferred to incorporate a polymer dispersing agent. The polymer dispersing agent preferably has basic functional groups in view of the affinity to the black colorant (B). Particularly excellent dispersibility will be achieved when the polymer dispersing agent has, as the basic functional groups, primary, secondary or tertiary amino groups. The polymer may, for example, be a urethane type, a polyimide type, an alkyd type, an epoxy type, a polyester type, a melamine type, a phenol type, an acrylic type, a polyether type, a vinyl chloride type, a vinyl chloride/vinyl acetate copolymer type, a polyamide type or a polycarbonate type. Among them, a urethane type or a polyester type is particularly preferred. Further, it may contain polymerized units derived from ethylene oxide or propylene oxide in its molecule.

Commercial products of the polymer dispersing agent having basic functional groups may, for example, be DISPARLON DA-7301 (manufactured by Kusumoto Chemicals, Ltd.); BYK161, BYK162, BYK16:3 and BYK182 (manufactured by BYK-Chemie); and Solsperse 5000 and Solsperse 17000 (manufactured by Zeneca Pigments & Additives).

The amount of addition of the polymer dispersing agent having basic functional groups is preferably from 5 to 30 wt %, more preferably from 10 to 25 wt % based on the black colorant (B). If the addition amount is too small, the dispersion performance tends to decrease, and if the addition amount is too large, the developability tends to decrease.

The photosensitive composition of the present invention contains a photopolymerization initiator (C) which is a compound represented by the following formula (3). The symbols in the formula are as defined above:

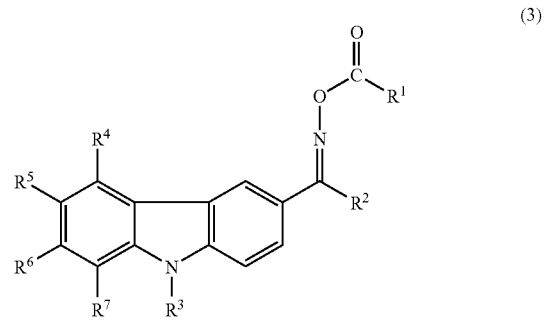

In the above compound, preferred substituents are as follows.

$R^1$: A $C_{1-10}$ alkyl group or a $C_{6-12}$ phenyl group of which a hydrogen atom in the benzene ring may be substituted by an alkyl group is preferred, and for example, a methyl group, an ethyl group, a propyl group, a butyl group, a pentyl group, a hexyl group, a heptyl group, an octyl group, a nonyl group, a decyl group or a phenyl group may be mentioned. A $C_{1-4}$ group is more preferred, a $C_{1-2}$ group is furthermore preferred, and a methyl group is particularly preferred.

$R^2$: A $C_{1-10}$ alkyl group or a $C_{2-5}$ alkoxycarbonyl group is preferred, and for example, a methyl group, an ethyl group, a propyl group, a butyl group, a pentyl group, a hexyl group, a heptyl group, an octyl group, a nonyl group, a decyl group, a methoxycarbonyl group, an ethoxycarbonyl group or a propoxycarbonyl group may be mentioned. A $C_{1-6}$ group is more preferred, a $C_{1-3}$ group is furthermore preferred, and a methyl group is particularly preferred.

$R^3$: A $C_{1-8}$ alkyl group is preferred, and for example, a methyl group, an ethyl group, a propyl group, a butyl group, a pentyl group, a hexyl group, a heptyl group, an octyl group, a nonyl group, a decyl group, an undecyl group or a dodecyl group may be mentioned. A $C_{2-6}$ group is more preferred, and an ethyl group is particularly preferred.

$R^4$, $R^6$, $R^7$: A hydrogen atom is preferred.

$R^5$: A $C_{7-20}$ benzoyl group of which a hydrogen atom in the benzene ring may be substituted by an alkyl group, or a $C_{7-20}$ benzylcarbonyl group of which a hydrogen atom in the benzene ring may be substituted by an alkyl group, is preferred, and a 2-methylbenzoyl group, a benzylcarbonyl group or a 1,3,5-trimethylbenzylcarbonyl group is more preferred.

Specific examples of an O-acyloxime compound which is the compound represented by the above formula (3) are as follows.

A compound represented by the formula (3) wherein $R^1$: a phenyl group, $R^2$: an octyl group, $R^3$: an ethyl group, $R^4$, $R^6$, $R^7$: a hydrogen atom, and $R^5$: a benzoyl group;

a compound represented by the formula (3) wherein $R^1$: a methyl group, $R^2$: an octyl group, $R^3$: an ethyl group, $R^4$, $R^6$, $R^7$: a hydrogen atom, and $R^5$: a benzoyl group;

a compound represented by the formula (3) wherein $R^1$: a methyl group, $R^2$: a butyl group, $R^3$: an ethyl group, $R^4$, $R^6$, $R^7$: a hydrogen atom, and $R^5$: a benzoyl group;

a compound represented by the formula (3) wherein $R^1$: a methyl group, $R^2$: a heptyl group, $R^3$: an ethyl group, $R^4$, $R^6$, $R^7$: a hydrogen atom, and $R^5$: a benzoyl group;

a compound represented by the formula (3) wherein $R^1$: a phenyl group, $R^2$: an octyl group, $R^3$: an ethyl group, $R^4$, $R^6$, $R^7$: a hydrogen atom, and $R^5$: a 2-methylbenzoyl group;

a compound represented by the formula (3) wherein $R^1$: a methyl group, $R^2$: an octyl group, $R^3$: an ethyl group, $R^4$, $R^6$, $R^7$: a hydrogen atom, and $R^5$: a 2-methylbenzoyl group;

a compound represented by the formula (3) wherein $R^1$: a methyl group, $R^2$: a methyl group, $R^3$: an ethyl group, $R^4$, $R^6$, $R^7$: a hydrogen atom, and $R^5$: a 2-methylbenzoyl group;

a compound represented by the formula (3) wherein $R^1$: a methyl group, $R^2$: a methyl group, $R^3$: an ethyl group, $R^4$, $R^6$, $R^7$: a hydrogen atom, and $R^5$: a 2-methyl-4-tetrahydropyranylmethoxybenzoyl group;

a compound represented by the formula (3) wherein $R^1$: a methyl group, $R^2$: a methyl group, $R^3$: an ethyl group, $R^4$, $R^6$, $R^7$: a hydrogen atom, and $R^5$: a 2-methyl-5-tetrahydrofuranylmethoxybenzoyl group; and a compound represented by the formula (3) wherein $R^1$: a methyl group, $R^2$: a methyl group, $R^3$: an ethyl group, $R^4$, $R^6$, $R^7$: a hydrogen atom, and $R^5$: a 2-methyl-5-tetrahydropyranylmethoxybenzoyl group.

A thiol compound such as 2-mercaptobenzimidazole, 2-mercaptobenzoxazole, 2-mercaptobenzothioazole, 1,4-butanolbis(3-mercaptobutyrate), tris(2-mercaptopropanoyloxyethyl)isocyanurate or pentaerythritol tetrakis(3-mercaptobutyrate) may be used in combination with a radical initiator to develop a sensitizing effect.

The proportion of the photopolymerization initiator (C) in the total solid content of the photosensitive composition is preferably from 1 to 10 mass %, more preferably from 2 to 5 mass %. Within such a range, good curing property will be achieved, and a pattern and a line width close to a mask pattern can be formed in the exposure step and the development step.

The photosensitive composition of the present invention preferably contains a photosensitive resin (D) having an acidic group and an ethylenic double bond in one molecule. By the photosensitive resin (D) having an acidic group, the non-exposed portion will be removed by an alkali developer. Further, by having an ethylenic double bond, the exposed portion will not be removed by an alkali developer. Accordingly, partition walls can be formed. The photosensitive resin (D) preferably contains substantially no group (1) nor group (2).

The acidic group may be at least one acidic group selected from the group consisting of a carboxy group, a phenolic hydroxy group, a sulfonic acid group and a phosphoric acid group. The ethylenic double bond may, for example, be an addition-polymerizable unsaturated group such as a (meth)acryloyl group, an allyl group, a vinyl group or a vinyl ether group. Some or all of hydrogen atoms in such a group may be substituted by a hydrocarbon group. The hydrocarbon group is preferably a methyl group.

As examples of the photosensitive resin (D), a polymer (D1) having a side chain containing an acidic group and a side chain containing an ethylenic double bond or a resin (D2) having an ethylenic double bond and an acidic group introduced to an epoxy resin, each being a copolymer of monomers containing an ethylenic double bond, may be mentioned.

The above polymer (D1) can be prepared in the same manner as in the preparation of the above polymer (A) except that the monomer (a1) containing the group (1) or the monomer (a2) containing the group (2) is not used. The ethylenic unsaturated monomer containing a phosphoric acid group may be 2-(meth)acryloyloxyethane phosphoric acid.

The above resin (D2) is preferably a compound obtained by reacting a reaction product of an epoxy resin with a compound containing a carboxy group and an ethylenic double bond, with a polybasic carboxylic acid or its anhydride.

The epoxy resin to be sued for preparation of the resin (D2) may be a bisphenol A type epoxy resin, a bisphenol F type epoxy resin, a phenol novolac type epoxy resin, a cresol novolac type epoxy resin, a trisphenolmethane type epoxy resin, an epoxy resin having a naphthalene skeleton, an epoxy resin having a biphenyl skeleton represented by the following formula (D21) (provided that is from 1 to 50, preferably from 2 to 10), or an epoxy resin represented by the following formula (D22) (provided that each of $R^7$, $R^8$, $R^9$ and $R^{19}$ which are independent of one another, is a hydrogen atom, a chlorine atom or a $C_{1-5}$ alkyl group, and t is from 0 to 10).

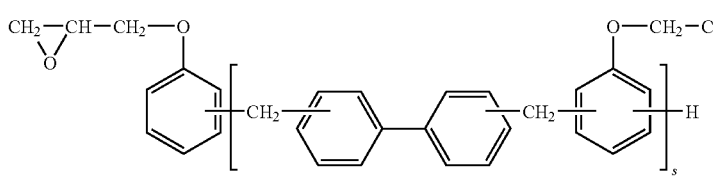
(D21)

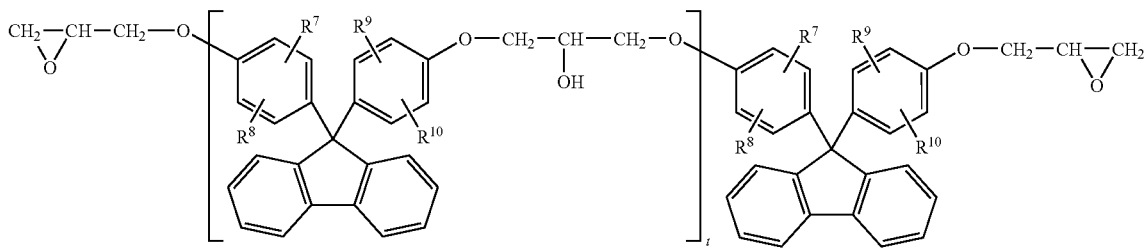
(D22)

An ethylenic double bond is introduced to an epoxy resin by reacting a compound containing a carboxy group and an ethylenic double bond with the epoxy resin. Further, by reacting a polybasic carboxylic acid or its anhydride therewith, it is possible to introduce the carboxy group as an acidic group. Especially, in a case where the compound containing a carboxy group and an ethylenic double bond is reacted with the epoxy resin represented by the formula (D22), and then a polybasic carboxylic anhydride is reacted therewith, it is preferred to react a mixture of dicarboxylic anhydride and tetracarboxylic dianhydride. It is thereby possible to control a molecular weight by changing the ratio of dicarboxylic anhydride and tetracarboxylic dianhydride.

Commercial products of the resin (D2) having an acidic group and an ethylenic double bond introduced to the epoxy resin may, for example, be KAYARAD PCR-1069, K-48C, CCR-1105, CCR-1115, CCR-1163H, CCR-1166H, CCR-1159H, TCR-1025, TCR-1064H, TCR-1286H, ZAR-1535H, ZFR-1122H, ZFR-1124H, ZFR-1185H, ZFR-1492H, ZCR-1571H, ZCR1569H, ZCR-1580H, ZCR1581H and ZCR-1588H (all manufactured by Nippon Kayaku Co., Ltd.).

The photosensitive resin (D) preferably has at least three ethylenic double bonds in one molecule, preferably at least 6 ethylenic double bonds in one molecule. It is thereby possible that the difference in alkali solubility may readily be made between an exposed portion and a non-exposed portion, and it becomes possible to form a fine pattern with less light exposure.

The acid value of the photosensitive resin (D) is preferably from 10 to 300 mgKOH/g, more preferably from 30 to 150 mgKOH/g. Within such a range, the developability of the photosensitive composition will be good.

The number average molecular weight of the photosensitive resin (D) is preferably at least 500 and less than 20,000, more preferably at least 2,000 and less than 15,000. Within such a range, the alkali solubility and the developability will be good.

The proportion of the photosensitive resin (D) in the total solid content of the photosensitive composition is preferably from 5 to 80 mass %, more preferably from 10 to 60 mass %. Within such a range, the developability of the photosensitive composition will be good.

The photosensitive composition preferably contains a radical crosslinking agent (E) containing at least two ethylenic double bonds and containing no acidic group, whereby the photocuring property of the photosensitive composition will improve, and formation of partition walls with low light exposure will be accelerated.

Specific examples of the radical crosslinking agent (E) may, for example, be diethylene glycol di(meth)acrylate, tetraethylene glycol di(meth)acrylate, tripropylene glycol di(meth)acrylate, neopentyl glycol di(meth)acrylate, 1,9-nonediol di(meth)acrylate, trimethylolpropane tri(meth)acrylate, pentaerythritol tri(meth)acrylate, pentaerythritol tetra(meth)acrylate, ditrimethylolpropane tetra(meth)acrylate, dipentaerythritol hexa(meth)acrylate, ethoxylated isocyanuric acid triacrylate and urethane acrylate. They may be used alone or in combination as a mixture of two or more of them.

The proportion of the radical crosslinking agent (E) in the total solid content of the photosensitive composition is preferably from 10 to 60 mass %, more preferably from 15 to 50 mass %. Within such a range, the alkali developability of the photosensitive composition will be good.

The photosensitive composition of the present invention may contain fine particles as the case requires. As the fine particles, various inorganic or organic fine particles may be used, and negatively charged fine particles are preferably used in view of the performance to absorb the basic polymer dispersing agent. Further, in view of the sensitivity, preferred are ones not having absorption at the wavelength of light to be applied in the exposure step, and particularly preferred are ones not having absorption to i-line (365 nm), h-line (405 nm) and g-line (436 nm) which are dominant wavelengths of an ultrahigh pressure mercury lamp.

The inorganic fine particles may, for example, be silica, zirconia, magnesium fluoride, ITO or ATO. The organic fine particles may, for example, be polyethylene or PMMA.

As the fine particles, from the viewpoint of heat resistance, inorganic fine particles are preferred, and from the viewpoint of the availability and dispersion stability, silica or zirconia is more preferred. The average particle size is preferably at most 1 μm, more preferably at most 200 nm, in view of the surface smoothness of the partition walls to be formed.

The proportion of the fine particles in the total solid content of the photosensitive composition is preferably from 3 to 20 mass %, more preferably from 5 to 15 mass %, furthermore preferably at least 7 mass % and less than 10 mass %. If the content is too low, the effect of suppressing a decrease in the liquid repellency by postbaking tends to be low, and if the content is too high, the stability of the liquid of the composition tends to decrease.

The photosensitive composition of the present invention may contain a silane coupling agent as the case requires. When a silane coupling agent is used, the adhesion of a coating film cured product to be formed from the composition to the substrate will improve.

Specific examples of the silane coupling agent may, for example, be tetraethoxysilane, 3-glycidoxypropyl trimethoxysilane, methyl trimethoxysilane, vinyl trimethoxysilane, 3-methacryloyloxypropyl trimethoxysilane, 3-chloropropyl trimethoxysilane, 3-mercaptopropyl trimethoxysilane, heptadecafluorooctylethyl trimethoxysilane, N-phenyl-3-aminopropyl trimethoxysilane, a polyoxyalkylene chain-containing triethoxysilane and imidazolesilane. They may be used alone or in combination as a mixture of two or more of them.

The photosensitive composition of the present invention may contain a thermosetting agent as the case requires. It is thereby possible to improve the heat resistance and water permeation resistance of the partition walls.

The thermosetting agent may, for example, be an amino resin, a compound having at least two epoxy groups, a compound having at least two hydrazino groups, a polycarbodiimide compound, a compound having at least two oxazoline groups, a compound having at least two aziridine groups, a polyvalent metal, a compound having at least two mercapto groups or a polyisocyanate compound.

Among the above thermosetting agents, an amino resin, a compound having at least two epoxy groups or a compound having at least two oxazoline groups is particularly preferred, whereby chemical resistance of the formed partition walls will be improved.

To the photosensitive composition of the present invention, a curing accelerator, a thickener, a plasticizer, a defoaming agent, a leveling agent, an anti-repellent, an ultraviolet absorber, etc. may be incorporated, as the case requires.

The photosensitive composition of the present invention is preferably applied on a substrate after a diluting agent is added thereto.

As the diluting agent, various monomers exemplified in the description of the polymer (A) may be used as a reactive diluting agent. Further, solvents exemplified in the description of the solvent to be used for the preparation of the polymer (A) may be used. As other examples, a linear hydrocarbon such as n-butane or n-hexane, a cyclic saturated hydrocarbon such as cyclohexane, or an aromatic hydrocarbon such as toluene, xylene or benzyl alcohol may, for example, be mentioned. They may be used alone or in combination as a mixture of two or more of them.

Now, a photolithography process using the photosensitive composition of the present invention will be mentioned.

(Coating Step)

Firstly, the composition of the present invention is applied on a substrate. As the substrate, its material is not particularly limited, but it may, for example, be various types of glass plates; an inorganic substrate such as a SIC substrate or a silicon; an inorganic oxide substrate such as ITO; a thermoplastic sheet of e.g. a polyester (such as polyethylene terephthalate), a polyolefin (such as polyethylene or polypropylene), a polycarbonate, a polymethyl methacrylate, a polysulfone, a polyimide or a poly(meth)acryl resin; or a cured sheet of a thermosetting resin such as an epoxy resin or an unsaturated polyester. A substrate comprising a glass plate and an organic film or an inorganic oxide film of e.g. TFT, ITO or $SiO_2$ solely formed on the glass plate, or a patterned substrate, or a substrate having such substrates laminated, may also be used. Especially, from the viewpoint of the heat resistance, a glass plate or a heat resistant plastic such as a polyimide is preferably employed. Further, a transparent substrate is preferred, since the post-exposure is carried out from the rear side on which no partition walls are formed (substrate side) in some cases.

The coating film-forming method may, for example, be a spin coating method, a spray coating method, a slit coating method, a roll coating method, a rotary coating method or a bar coating method.

The thickness of the coating film varies depending on the material of the substrate and the purpose of use, and is preferably from 0.3 to 300 µm, more preferably from 1 to 60 µm.

(Drying Step)

Then, the coating film is dried. By the drying, the diluting agent will evaporate, whereby a coating film having no adhesion will be obtained. It is preferred to carry out vacuum drying or drying by heating. Further, it is more preferred to carry out vacuum drying and drying by heating in combination for efficient drying without non-uniformity in the outer appearance of the coating film. The drying conditions vary depending upon the types of the respective components, the blend proportions, etc., and preferably, the vacuum drying is carried out within wide ranges of from 10 to 500 Pa (absolute pressure) for from about 10 to about 300 seconds, and the drying by heating is carried out within wide ranges of from 50 to 120° C. for from about 10 to about 2,000 seconds.

(Exposure Step)

Then, exposure is preferably carried out via a mask having a predescribed pattern on a part of the dried coating film. The light to be irradiated may, for example, be visible light, ultraviolet rays, far ultraviolet rays, an excimer laser such as KrF excimer laser, ArF excimer laser, $F_2$ excimer laser, $Kr_2$ excimer laser, KrAr excimer laser or $Ar_2$ excimer laser, X-rays, or electron beams. Light having a wavelength of from 100 to 600 nm is preferred, electromagnetic waves having a distribution within a range of from 300 to 500 nm are more preferred, electromagnetic waves having a distribution within a range of from 300 to 500 nm are more preferred, and i-line (365 nm), h-line (405 nm) or g-line (436 nm) is particularly preferred.

As an irradiation device, a known ultrahigh pressure mercury lamp may, for example, be used. Light exposure is preferably from 5 to 1,000 $mJ/cm^2$, more preferably from 10 to 400 $mJ/cm^2$, furthermore preferably from 20 to $mJ/cm^2$, particularly preferably from 50 to 100 $mJ/cm^2$, based on the i-line in a case where electromagnetic waves of at most 350 nm are cut by e.g. a filter. If the light exposure is too low, curing of partition walls tends to be inadequate, and in the subsequent development, dissolution or peeling is likely to occur. If the light exposure is too high, it tends to be difficult to obtain a high resolution.

(Development Step)

After the exposure step, development is carried out by a developer to remove a non-exposed portion. As the developer, it is possible to employ an aqueous alkali solution containing an alkali such as an inorganic alkali, an amine, an alcoholamine or a quaternary ammonium salt.

The developing time (time during which the coating film is in contact with the developer) is preferably from 5 to 180 seconds. Further, the developing method may be any method such as a paddle method, a dipping method or a shower method. After the development, washing with running water is carried out, followed by drying with compressed air or compressed nitrogen to remove moisture on the substrate.

(Post-Exposure Step)

Then, post-exposure may be carried out as the case requires. The post-exposure may be carried out from either the front side on which partition walls are formed or the rear side (the substrate side) on which no partition walls are formed. Otherwise, the exposure may be carried out from both the front and rear sides. The light exposure is preferably at least 50 mJ/cm$^2$, more preferably at least 200 mJ/cm$^2$, furthermore preferably at least 1,000 mJ/cm$^2$, particularly preferably at least 2,000 mJ/cm$^2$.

As light to be applied, ultraviolet rays are preferred, and as a light source, a known ultrahigh pressure mercury lamp or high pressure mercury lamp may, for example, be used. Such a light source is preferably employed, since it emits light of at most 600 nm which contributes to curing of partition walls, and emission of light of at most 200 nm which causes decomposition by oxidation of partition walls is thereby little. Further, it is preferred that a quartz tube glass used for a mercury lamp has an optical filter function to shield light of at most 200 nm.

Otherwise, a low pressure mercury lamp may also be used as a light source. However, with a low pressure mercury lamp, the emission intensity of wavelength of at most 200 nm is high, and decomposition by oxidation of partition walls is likely to take place by formation of ozone, and accordingly, it is not desirable to carry out a large quantity of exposure. The light exposure is preferably at most 500 mJ/cm$^2$, more preferably at most 300 mJ/cm$^2$.

(Postbaking Step)

Then, it is preferred to heat the partition walls. A pattern comprising partition walls and regions (dots) partitioned by the partition walls is formed by carrying out heat treatment by a heating device such as a hot plate or an oven at from 150 to 250° C. for from 5 to 90 minutes. The heating temperature is more preferably at least 180° C. If the heating temperature is too low, curing of the partition walls tends to be inadequate, whereby no sufficient chemical resistance will be obtained, and accordingly, in a case where they are coated with an ink in the following ink jet coating step, the partition walls may be swelled by the solvent contained in the ink, or the ink may bleed. On the other hand, if the heating temperature is too high, heat decomposition of the partition walls may occur.

By the above-described photolithography process, partition walls can be obtained. Since the partition walls made of a cured product of the composition of the present invention are black, the partition walls of the present invention can constitute a black matrix. That is, by forming partition walls, a black matrix can be formed.

It is possible to use the photosensitive composition of the present invention for pattern formation having a width of partition walls of preferably at most 100 μm, more preferably at most 20 μm in average. Further, it is possible to use the composition for pattern formation having a distance (width of a dot) between adjacent partition walls of preferably at most 300 μm, more preferably at most 100 μm in average. Further, it is possible to use it for pattern formation having a height of partition walls of preferably from 0.05 to 50 μm, more preferably from 0.2 to 10 μm, particularly preferably from 0.5 to 3 μm in average.

The water-and-oil repellency of a coating film cured product formed from the photosensitive composition can be estimated by the contact angle to water and propylene glycol 1-monomethyl ether 2-acetate (hereinafter sometimes referred to as PGMEA), and the contact angle to water is preferably at least 90°, more preferably at least 95°. Further, the contact angle to PGMEA is preferably at least 20°, more preferably at least 25°. Further, the water-and-oil repellency of a coating film cured product is particularly preferably such that the contact angle to water is at least 90° C., and the contact angle to PGMEA is at least 20°.

[Formation of Color Filter]

After the black matrix is formed as described above, an ink is injected by an ink jet method within regions partitioned by the black matrix to form pixels, thereby to form a color filter.

The ink jet apparatus to be used for forming such pixels is not particularly limited, and it is possible to use an ink jet apparatus employing various methods, such as a method of continuously jetting an electrified ink and controlling it by a magnetic field, a method of periodically spraying an ink by using piezoelectric elements, a method of heating an ink and intermittently jetting it by utilizing its foaming.

The shape of pixels may be of any known configuration such as a stripe type, a mosaic type, a triangle type or a 4-pixel configuration type.

The ink to be used for forming pixels, mainly comprises a coloring component, a binder resin component and a solvent component. As the coloring component, it is preferred to employ a pigment or dye excellent in heat resistance, light resistance, etc. As the binder resin component, a transparent resin excellent in heat resistance is preferred, such as an acrylic resin, a melamine resin or an urethane resin. A water-base ink comprises, as the solvent, water and, if necessary, a water-soluble organic solvent, and as the binder resin component, a water-soluble resin or a water-dispersible resin, and it contains various additives as the case requires. Whereas, an oil-base ink comprises an organic solvent as the solvent and a resin soluble in the organic solvent as the binder resin component, and it contains various additives as the case requires.

Further, after injecting an ink by an ink jet method, if required, it is preferred to carry out drying, heat-curing or ultraviolet ray-curing.

After forming pixels, an overcoat layer may be formed as the case requires. Such an overcoat layer is formed for the purpose of improving the surface flatness and for the purpose of preventing an eluent from the ink at the black matrix or pixels from reaching to the liquid crystal layer. In a case where such an overcoat layer is to be formed, it is preferred to preliminarily remove the liquid repellency of the black matrix. In a case where the liquid repellency is not removed, the overcoating liquid will be repelled, and a uniform film thickness tends to be hardly obtainable, such being undesirable. The method for removing the liquid repellency of the black matrix may, for example, be plasma ashing treatment or photo ashing treatment.

Further, as the case requires, it is preferred to form a photo-spacer on the black matrix to improve the product quality of a liquid crystal panel to be produced by using a color filter.

[Formation of Organic EL Display Device]

After the black matrix is formed as described above, an ink is injected by an ink jet method within regions partitioned by the black matrix to form pixels thereby to form an organic EL display device.

Before the black matrix is formed, a transparent electrode of e.g. indium tin oxide (ITO) is formed by e.g. a sputtering method on a transparent substrate of e.g. glass, and if necessary, the transparent electrode is etched to have a desired pattern. Then, the black matrix of the present invention is formed. Then, by using an ink jet method, solutions of a hole transport material and a luminescent material are sequentially applied within dots and dried to form a hole transport layer and a luminescent layer. Then, an electrode of e.g. aluminum is formed by e.g. a vapor deposition method, whereby pixels for an organic EL display device will be obtained.

EXAMPLES

Now, the present invention will be described in further detail with reference to Examples of the present invention (Examples 5 to 10) and Comparative Examples (Examples 11 and 12), but it should be understood that the present invention is by no means thereby restricted. In the following, "part(s)" is based on mass, unless otherwise specified.

The number average molecular weight was measured by means of a gel permeation chromatography method using polystyrene as the standard substance.

The content of fluorine atoms in the fluoropolymer (A) was calculated by $^{19}$F NMR measurement using 1,4-ditrifluoromethylbenzene as the standard substance. The amount of ethylenic double bonds in the fluoropolymer (A) was calculated by $^{1}$H NMR measurement using 1,4-ditrifluoromethylbenzene as the standard substance.

The acid value (mgKOH/g) and the number of ethylenic double bonds per molecule, are theoretical values calculated from the blend proportions of monomers as the raw materials.

Abbreviations of compounds used in the following respective Examples will be shown.

X-174DX: Dimethylsilicone chain-containing methacrylate (manufactured by Shin-Etsu Chemical Co., Ltd., tradename: X-22-174DX), X-8201: Dimethylsilicone chain-containing methacrylate (manufactured by Shin-Etsu Chemical Co., Ltd., tradename: X-24-8201),

C6FMA: $CH_2$=$C(CH_3)COOCH_2CH_2(CF_2)_6F$,

AA: Acrylic acid,

MAA: Methacrylic acid,

2-HEMA: 2-Hydroxyethyl methacrylate,

IBMA: Isobornyl methacrylate,

V-70: 2,2'-Azobis(4-methoxy-2,4-dimethylvaleronitrile) (manufactured by Wako Pure Chemical Industries, Ltd., tradename: V-70), 2-ME: 2-Mercaptoethanol, AOI: 2-Acryloyloxyethyl isocyanate (manufactured by Showa Denko K.K., tradename: Karenz AOI), BEI: 1,1-Bis(acryloyloxymethyl)ethyl isocyanate (manufactured by Showa Denko K.K., tradename: Karenz BEI), DBTDL: Dibutyltin dilaurate, BHT: 2,6-Di-t-butyl-p-cresol, MEK: 2-Butanone, OXE02: Ethanone 1-[9-ethyl-6-(2-methylbenzoyl)-9H-carbazolyl-3-yl]-1-(O-acetyloxime) (a compound represented by the formula (3) wherein $R^1$: a methyl group, $R^2$: a methyl group, $R^3$: an ethyl group, $R^4$, $R^6$, $R^7$: a hydrogen atom and $R^5$: a 2-methylbenzoyl group, manufactured by Ciba Specialty Chemicals K.K., tradename: OXE02), BD1: 1,4-Butanolbis(3-mercaptobutyrate) (manufactured by Showa Denko K.K., tradename: Karenz MT BD1), BOT: 2-Mercaptobenzoxazole, IR369: 2-Benzyl-2-dimethylamino-1-(4-morpholinophenyl)-butanone-1 (manufactured by Ciba-Geigy K.K., tradename IRGACURE-369), DETX-S: Isopropylthioxanthone (manufactured by NIPPON KAYAKU CO., LTD., tradename: DETX-S), EX1010: A resin having an ethylenic double bond and an acidic group introduced to the epoxy resin represented by the above formula (D22) (manufactured by Nagase ChemteX Corporation, tradename: EX-1010, solid content: 70 mass %), ZCR1569: A resin having an ethylenic double bond and an acidic group introduced to an epoxy resin having a biphenyl skeleton represented by the above formula (D21) (manufactured by NIPPON KAYAKIJ CO., LTD., tradename: ZCR-1569, solid content: 70 mass %), ZCR1588: A resin having an ethylenic double bond and an acidic group introduced to an epoxy resin having a naphthalene skeleton (manufactured by NIPPON KAYAKU CO., LTD., tradename: ZCR-1588, solid content: 70 mass %), R565: An acrylic polymer, a resin having an ethylenic double bond and an acidic group introduced (manufactured by OSAKA ORGANIC CHEMICAL INDUSTRY LTD, tradename: VISCOAT R-565, solid content: 70 mass %), A9300: Ethoxylated isocyanuric acid triacrylate (manufactured by SHIN-NAKAMURA CHEMICAL CO., LTD., tradename: NK ester A-9300), UX5001: Multifunctional urethane acrylate oligomer (manufactured by NIPPON KAYAKU CO., LTD., tradename: KAYARAD UX-5001T), PGMEA: Propylene glycol 1-monomethyl ether 2-acetate, CB: Carbon black dispersion (average secondary particle size: 120 nm, propylene glycol monomethyl ether acetate solution, carbon black content: 20 mass %, polyurethane polymer dispersing agent having an amine value of 18 mgKOH/g: 5 mass %), and Silica: Silica dispersion (average particle size: 20 nm, propylene glycol monomethyl ether acetate solution, silica content: 30 mass %, negatively charged).

Example 1

Preparation of Polymer (A-1)

(Copolymerization)

Into an autoclave having an internal capacity of 1 L and equipped with a stirrer, MEK (420.0 g), X-174DX (5.4 g), AA (18.0 g), 2-HEMA (99.0 g), IBMA (57.6 g), a chain transfer agent 2-ME (2.5 g) and a polymerization initiator V-70 (7.9 g) were charged, and polymerized at 30° C. for 24 hours with stirring in a nitrogen atmosphere to obtain a solution of copolymer 1. To the obtained MEK solution of copolymer 1, heptane was added for reprecipitation for purification, followed by vacuum drying to obtain 152.0 g of copolymer 1. The number average molecular weight was 4,000.

(Introduction of Ethylenic Double Bonds)

Into a glass flask having an internal capacity of 300 mL and equipped with a thermometer, a stirrer and a heating device, copolymer 1 (40.0 g), BEI (42.0 g), DBTDL (0.17 g), BHT (2.1 g) and MEK (115.4 g) were charged and reacted at 40° C. for 48 hours with stirring to obtain a solution of polymer (A-1). To the MEK solution of the obtained polymer (A-1), heptane was added for reprecipitation for purification, followed by vacuum drying to obtain 65.6 g of polymer (A-1). The number average molecular weight was 6,400. Polymer (A-1) was subjected to infrared spectroscopic analysis, and as a result, an absorption band (1,635 cm$^{-1}$) derived from a C=C stretching vibration of an acryloyl group, an absorption band (1,409 cm$^{-1}$) derived from a $CH_2$ in-plane bending vibration of an acryloyl group and an absorption band (810 cm$^{-1}$) derived from a $CH_2$ out-of-plane bending vibration of an acryloyl group were observed, and further an absorption band (2,274 cm$^{-1}$) derived from an NCO stretching vibration of BEI disappeared, whereby it was confirmed that an acryloyl group is present in polymer (A-1).

Examples 2 to 4

Preparation of Polymers (A-2) to (A-4)

Copolymers 2 and 3 were obtained by copolymerization reaction in the same manner as in Preparation of copolymer 1 except that mixing of materials was changed as shown in Table 1. Then, polymers (A-2) to (A-4) were obtained by reactions in the same manner as in Preparation of polymer (A-1) except that mixing of materials was changed as shown in Table 2. The number average molecular weight of the obtained polymer, the content of silicon atoms in the polymer, the content of fluorine atoms, the number of ethylenic double bonds (amount of C=C, ×10$^{-3}$ mol/g) and the acid value (mgKOH/g) are shown in Table 2.

TABLE 1

| Copolymerization reaction | Copolymer 1 | Copolymer 2 | Copolymer 3 |
|---|---|---|---|
| X-174DX | 5.4 | — | — |
| X-8201 | — | 27.0 | — |
| C6FMA | — | 66.6 | 93.6 |
| AA | 18.0 | — | — |
| MAA | — | 14.4 | 14.4 |
| 2-HEMA | 99.0 | 72.0 | 72.0 |
| IBMA | 57.6 | — | — |
| V-70 | 7.9 | 5.5 | 5.8 |
| 2-ME | 2.5 | — | 3.5 |
| MEK | 420 | 420 | 420 |

TABLE 2

| Introduction of double bonds | Ex. 1 | Ex. 2 | Ex. 3 | Ex. 4 |
|---|---|---|---|---|
| Copolymer 1 | 40 | — | — | — |
| Copolymer 2 | — | 40 | — | — |
| Copolymer 3 | — | — | 40 | 50 |
| BEI | 42.0 | 30.5 | 30.5 | — |
| AOI | — | — | — | 21.7 |
| DBTDL | 0.17 | 0.12 | 0.12 | 0.087 |
| BHT | 2.1 | 1.5 | 1.5 | 1.1 |
| MEK | 115.4 | 109.4 | 109.4 | 128.1 |
| Polymer | A-1 | A-2 | A-3 | A-4 |
| Yield (g) | 65.6 | 59.2 | 56.3 | 63.8 |
| Number average molecular weight | 6400 | 9650 | 4900 | 4500 |
| Si atom content (%) | 0.55 | 3.12 | — | — |
| F atom content (%) | — | 12.0 | 16.9 | 20.7 |
| C—C amount (×10$^{-3}$ mol/g) | 4.13 | 3.49 | 3.49 | 2.15 |
| Acid value (mgKOH/g) | 38.0 | 29.6 | 29.6 | 36.4 |

Examples 5 to 12

Preparation of Photosensitive Composition, Formation and Evaluation of Partition Walls In the proportions (parts by mass) as identified in Tables 3 and 4, a polymer (A), a black colorant (B), a photopolymerization initiator (C), a photosensitive resin (D), a radical crosslinking agent (E), fine particles and a diluting agent were mixed to obtain a photosensitive composition.

The photosensitive composition was applied on a glass substrate by using a spinner, and dried on a hot plate at 100° C. for 2 minutes to form a coating film having a thickness of 2.0 μm. Then, via a mask (a lattice patter with a light-transmitting portion of 100 um×200 μm and a light shielding portion of 20 μm), the coating film was irradiated with a prescribed light exposure shown in Table 3 or 4 by means of an ultrahigh pressure mercury lamp.

Then, a non-exposed portion was dipped in an inorganic alkali type developer (10 times diluted aqueous solution of SemiClean DL-A4, tradename, manufactured by YOKOHAMA OILS & FATS INDUSTRY CO., LTD.) and developed, and the non-exposed portion was washed off with water, followed by drying.

Then, heating was carried out at 220° C. for 1 hour on a hot plate to obtain a glass substrate (1) having a pattern formed thereon. Further, a glass substrate (2) having a coating film cured product formed thereon was obtained in the same manner as the above except that the exposure was carried out without using the above mask. With respect to these substrates, the developability, the adhesion to the substrate, the water-and-oil repellency and an ink residue on partition walls were measured and evaluated by the following methods. Evaluation results are shown in Tables 3 and 4.

[Developability]

With regard to the glass substrate (1), one completely developed was identified by ○, and one having a portion not developed was identified by x.

[Adhesion to the Substrate]

With regard to the above glass substrate (2), the adhesion was evaluated by the cross-cut tape method as disclosed in JIS K5400. The coating film cured product was cross-cut by a cutter in a distance of 2 mm to have 25 sections. Then, an adhesive tape was bonded and peeled. The adhesion state of the coating film cured product was visually evaluated in such a manner that symbol ○ indicates a case where no sections were peeled, and symbol x indicates a case where almost all sections were peeled.

[Water-and-Oil Repellency]

The water-and-oil repellency was evaluated by the contact angle (degrees) to water and PGMEA on the surface of a coating film cured product of the above glass substrate (2). The contact angle is an angle between the solid surface and the tangent line against the liquid surface at a point where the solid and the liquid are in contact with each other, and it was defined by the angle on the side containing the liquid. The larger the angle, the better the water-and-oil repellency of the coating film cured product. The contact angle to water being at least 95° was represented by ○; the same contact angle being at least 90° and less than 95° was represented by Δ; and the same contact angle being less than 90° was represented by x. The contact angle to PGMEA being at least 25° was represented by ○; the same contact angle being at least 20° and less than 25° was represented by Δ; and the same contact angle being less than 20° was represented by x. Further, in Tables 3 and 4, the water-and-oil repellency is represented as (the contact angle to water)/(the contact angle to PGMEA)=○/○.

[Ink Residue on Partition Walls]

With regard to the above glass substrate (1), about 70 pL of a 1% solution (water/ethanol=75/25) of poly-3,4-ethylenedioxythiophene and polystyrene sulfonate was dropped onto a lattice portion (20 μm) as a partition wall by ink jet method, and an ink residue remained in the lattice portion was evaluated. By visually observing a photograph obtained by an ultra deep shape measuring microscope VK-8500 (manufactured by Keyence Corporation), the residue was evaluated such that ○ indicates a case where no ink residue remained in the lattice portion, and x indicates a case where an ink residue remained in the lattice portion.

TABLE 3

| | | Examples | | | | |
|---|---|---|---|---|---|---|
| | | 5 | 6 | 7 | 8 | 9 |
| Polymer (A) | | (A-1) | (A-2) | (A-4) | (A-3) | (A-3) |
| | | 0.36 | 0.36 | 0.09 | 009 | 0.09 |
| Black colorant (B) | CB | 29.8 | 29.8 | 29.9 | 37.4 | 55.4 |
| Photopolymerization initiator (C) | OXE02 | 0.84 | 0.84 | 0.84 | 0.78 | 0.61 |
| | BD1 | 0.42 | 0.42 | 0.42 | 0.39 | 0.30 |
| | BOT | — | — | — | — | — |
| | IR369 | — | — | — | — | — |
| | DETX-S | — | — | — | — | — |
| Photosensitive resin (D) | R565 | 21.1 | 21.1 | 21.1 | — | — |
| | ZCR1588 | — | — | — | 19.4 | — |
| | EX1010 | — | — | — | — | 15.2 |
| | ZCR1569 | — | — | — | — | — |
| Radical crosslinking agent (E) | A9300 | 6.3 | 6.3 | 6.4 | 5.8 | 4.6 |
| | UX5001 | — | — | — | — | — |
| Fine particles | Silica | — | — | — | — | — |
| Diluting agent | PGMEA | 41.2 | 41.2 | 41.2 | 36.1 | 23.9 |
| Proportion (%) of polymer (A) in the total solid content | | 1.2 | 1.2 | 0.30 | 0.30 | 0.30 |
| Proportion (%) of black colorant (B) in the total solid content | | 19.8 | 19.8 | 19.9 | 24.9 | 36.9 |
| Light exposure 100 (mJ/cm$^2$) | Developability | ○ | ○ | ○ | ○ | ○ |
| | Adhesion to the substrate | ○ | ○ | ○ | ○ | ○ |
| | Water-and-oil repellency | ○/○ | ○/○ | ○/○ | ○/○ | ○/○ |
| | Ink residue on partition walls | ○ | ○ | ○ | ○ | ○ |
| Light exposure 200 (mJ/cm$^2$) | Developability | ○ | ○ | ○ | ○ | ○ |
| | Adhesion to the substrate | ○ | ○ | ○ | ○ | ○ |
| | Water-and-oil repellency | ○/○ | ○/○ | ○/○ | ○/○ | ○/○ |
| | Ink residue on partition walls | ○ | ○ | ○ | ○ | ○ |

TABLE 4

| | | Examples | | |
|---|---|---|---|---|
| | | 10 | 11 | 12 |
| Polymer (A) | | (A-4) | (A-4) | (A-4) |
| | | 0.09 | 0.09 | 0.09 |
| Black colorant (B) | CB | 40.4 | 30.0 | 29.9 |
| Photopolymerization initiator (C) | OXE02 | 0.73 | — | — |
| | BD1 | — | — | — |
| | BOT | 0.73 | — | — |
| | IR369 | — | 1.5 | 1.5 |
| | DETX-S | — | 1.5 | 1.5 |
| Photosensitive resin (D) | R565 | — | 19.4 | — |
| | ZCR1588 | — | — | — |
| | EX1010 | — | — | — |
| | ZCR1569 | 16.7 | — | 17.6 |
| Radical crosslinking agent (E) | A9300 | — | 5.8 | — |
| | UX5001 | 5.0 | — | 5.3 |
| Fine particles | Silica | 5.6 | — | 5.9 |
| Diluting agent | PGMEA | 30.7 | 41.7 | 38.1 |
| Proportion (%) of polymer (A) in the total solid content | | 0.30 | 0.30 | 0.30 |
| Proportion (%) of black colorant (B) in the total solid content | | 26.9 | 19.9 | 19.9 |
| Light exposure 100 (mJ/cm$^2$) | Developability | ○ | ○ | ○ |
| | Adhesion to the substrate | ○ | ○ | ○ |
| | Water-and-oil repellency | ○/○ | X/Δ | X/Δ |
| | Ink residue on partition walls | ○ | X | X |
| Light exposure 200 (mJ/cm$^2$) | Developability | ○ | ○ | ○ |
| | Adhesion to the substrate | ○ | ○ | ○ |
| | Water-and-oil repellency | ○/○ | X/Δ | X/Δ |
| | Ink residue on partition walls | ○ | X | X |
| Light exposure 500 (mJ/cm$^2$) | Developability | ○ | ○ | ○ |
| | Adhesion to the substrate | ○ | ○ | ○ |
| | Water-and-oil repellency | ○/○ | ○/○ | ○/○ |
| | Ink residue on partition walls | ○ | ○ | ○ |

In Examples 11 and 12, no photopolymerization initiator which is a compound represented by the formula (3) is incorporated, whereby the liquid repellency is poor, and the amount of the ink residue on partition walls is large, with a light exposure of 100 mJ/cm$^2$ or 200 mJ/cm$^2$.

INDUSTRIAL APPLICABILITY

From the photosensitive composition of the present invention, partition walls having a high optical density and having liquid repellency can be obtained even by exposure with low light exposure. For example, such a composition is suitably used for formation of partition walls for production of a color filter and for production of an organic EL display device, utilizing an ink jet printing technique.

The entire disclosure of Japanese Patent Application No. 2007-142104 filed on May 29, 2007 including specification, claims and summary is incorporated herein by reference in its entirety.

What is claimed is:

1. A photosensitive composition, which comprises a polymer (A) having a side chain containing a group represented by the following formula (1) or a group represented by the following formula (2) and a side chain containing an ethylenic double bond in one molecule, a black colorant (B), a photopolymerization initiator (C) which is a compound represented by the following formula (3), and a photosensitive resin (D) containing an acidic group and an ethylenic double bond in one molecule, wherein the proportion of the black colorant (B) in the total solid content of the composition is from 15 to 60 mass %:

—CFXR$^f$    formula (1)

wherein X is a hydrogen atom, a fluorine atom or a trifluoromethyl group, and R$^f$ is an alkyl group having at most 20 carbon atoms which may have an etheric oxygen atom, at least one of hydrogen atoms of which is substituted by a fluorine atom, or a fluorine atom;

—(SiR$^1$R$^2$O)$_n$—SiR$^1$R$^2$R$^3$    formula (2)

wherein each of R$^1$ and R$^2$ which are independent of each other, is a hydrogen atom, an alkyl group, a cycloalkyl group or an aryl group, R$^3$ is a hydrogen atom or a C$_{1-10}$ organic group, and n is an integer of from 1 to 200;

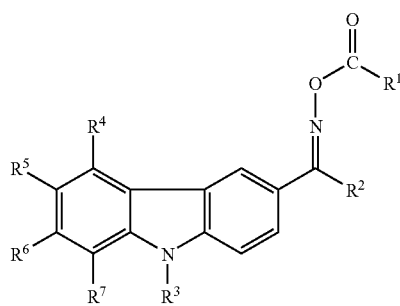
(3)

wherein R$^1$ is a hydrogen atom, a C$_{1-12}$ alkyl group, a C$_{3-8}$ cycloalkyl group, a C$_{2-5}$ alkenyl group, a C$_{6-20}$ phenyl group or a C$_{6-20}$ phenoxy group of which a hydrogen atom in the benzene ring may be substituted by an alkyl group;

R$^2$ is a hydrogen atom, a C$_{1-20}$ alkyl group, a C$_{3-8}$ cycloalkyl group, a C$_{6-20}$ phenyl group of which a hydrogen atom in the benzene ring may be substituted by an alkyl group, a C$_{2-20}$ alkanoyl group, a C$_{7-20}$ benzoyl group of which a hydrogen atom in the benzene ring may be substituted by an alkyl group, a C$_{2-12}$ alkoxycarbonyl group, or a C$_{7-20}$ phenoxycarbonyl group of which a hydrogen atom in the benzene ring may be substituted by an alkyl group;

R$^3$ is a C$_{1-12}$ alkyl group; and each of R$^4$, R$^5$, R$^6$ and R$^7$ which are independent of one another, is a hydrogen atom, a C$_{1-12}$ alkyl group, a C$_{3-8}$ cycloalkyl group of which a hydrogen atom in the cyclohexane ring may be substituted by an alkyl group, a C$_{6-20}$ phenyl group of which a hydrogen atom in the benzene ring may be substituted by an alkyl group, a C$_{2-20}$ alkanoyl group, a C$_{7-20}$ benzoyl group of which a hydrogen atom in the benzene ring may be substituted by an alkyl group, a C$_{7-20}$ benzylcarbonyl group of which a hydrogen atom in the benzene ring may be substituted by an alkyl group, a C$_{2-12}$ alkoxycarbonyl group, a C$_{7-20}$ phenoxycarbonyl group of which a hydrogen atom in the benzene ring may be substituted by an alkyl group, a C$_{1-20}$ amide group or a nitro group.

2. The photosensitive composition according to claim 1, wherein the polymer (A) has a side chain containing at least two ethylenic double bonds per one side chain.

3. The photosensitive composition according to claim 1, wherein the polymer (A) further has a side chain containing an acidic group.

4. The photosensitive composition according to claim 3, wherein the acid value of the polymer (A) is at most 100 (mgKOH/g).

5. The photosensitive composition according to claim 1, wherein the amount of the ethylenic double bonds in the polymer (A) is from $1.0 \times 10^{-3}$ to $5.0 \times 10^{-3}$ mol/g.

6. The photosensitive composition according to claim 1, wherein the black colorant (B) is carbon black.

7. The photosensitive composition according to claim 1, wherein the proportion of the photopolymerization initiator (C) in the total solid content of the photosensitive composition is from 1 to 10 mass %.

8. The photosensitive composition according to claim 1, which further contains a radical crosslinking agent (E) containing at least two ethylenic double bonds and containing no acidic group.

9. Partition walls having a cured product of the photosensitive composition as defined in claim 1.

10. The partition walls according to claim 9, wherein of the cured product, the contact angle to water is at least 90°, and the contact angle to PGMEA is at least 20°.

11. A black matrix comprising the partition walls as defined in claim 9.

12. A color filter, which comprises a substrate, a plurality of pixels on the substrate, and partition walls located among the adjacent pixels, wherein the partition walls are made of a cured product of the photosensitive composition as defined in claim 1.

13. An organic EL device, which comprises a substrate, a plurality of pixels on the substrate, and partition walls located among the adjacent pixels, wherein the partition walls are made of a cured product of the photosensitive composition as defined in claim 1.

* * * * *